United States Patent

Hegner et al.

[11] Patent Number: 5,194,697
[45] Date of Patent: Mar. 16, 1993

[54] ELECTRICALLY CONDUCTIVE FEEDTHROUGH CONNECTION AND METHODS OF MANUFACTURING SAME

[75] Inventors: Frank Hegner, Maulburg; Thomas Klähn, Freiburg, both of Fed. Rep. of Germany

[73] Assignee: Endress u. Hauser GmbH u. Co., Maulburg, Fed. Rep. of Germany

[21] Appl. No.: 496,460

[22] Filed: Mar. 20, 1990

[30] Foreign Application Priority Data

Mar. 21, 1989 [DE] Fed. Rep. of Germany ....... 3909186

[51] Int. Cl.$^5$ .............................................. H01B 17/26
[52] U.S. Cl. .................................. 174/151; 174/50.56; 174/152 GM; 174/50.61; 174/50.62
[58] Field of Search ............... 174/50.56, 50.61, 50.62, 174/152 GM, 263, 262, 151; 361/283; 338/36, 42

[56] References Cited

U.S. PATENT DOCUMENTS

| | | | |
|---|---|---|---|
| 2,121,590 | 6/1938 | Espe | 174/50.56 |
| 3,436,109 | 4/1969 | Loose | 403/29 |
| 3,858,097 | 12/1974 | Polye | 317/248 |
| 3,901,772 | 8/1975 | Guillotin et al. | 204/16 |
| 4,345,299 | 8/1982 | Ho | 361/283 |
| 4,371,588 | 2/1983 | Kyle | 428/448 |

FOREIGN PATENT DOCUMENTS 0351701 1/1990 European Pat. Off. .

OTHER PUBLICATIONS

"Vakuumichte Metall-Keramik-Verbindungen", pp. 69–71 ETZ-B, a German periodical, Mar. 21, 1958, Von Korlernst Müller.

Primary Examiner—Leo P. Picard
Assistant Examiner—Hyung S. Sough
Attorney, Agent, or Firm—Barnes & Thornburg

[57] ABSTRACT

A mechanically heavily loadable and high-vacuum-tight feedthrough connection through a hole (2) of a high-temperature-resistant and vacuum-proof insulating part (1), particularly of ceramic, glass, or a single crystal, is disclosed which can be produced in a single high-temperature step and is thus inexpensive. It is designed as a terminal lead (4) covered with active solder and soldered into the hole, the terminal lead having a coefficient of thermal expansion less than that of the insulating part (1). The feedthrough connection is preferably used in a capacitive pressure sensor (10) having a diaphragm (11) and a substrate (12) which have spaced-apart, flat inner surfaces which are provided with at least one conductive layer (14, 15) for forming at least one capacitor and are electrically connected to the respective rear side via the feedthrough connection.

4 Claims, 1 Drawing Sheet

ELECTRICALLY CONDUCTIVE FEEDTHROUGH CONNECTION AND METHODS OF MANUFACTURING SAME

BACKGROUND AND SUMMARY OF THE INVENTION

The present invention relates to an electrically conductive feedthrough connection through a hole of a high-temperature-resistant and vacuum-proof insulating part, particularly of ceramic, glass, or a single crystal, which feedthrough connection is designed as a terminal lead covered with active solder and soldered into the hole. The terminal lead has a coefficient of thermal expansion less than that of the insulating part. The connection is used in a pressure sensor comprising a diaphragm and a substrate which have spaced-apart, flat inner surfaces, provided with at least one conductive or resistive layer for forming at least one capacitor or strain gage, respectively, and wherein the conductive surfaces are electrically connected to the respective rear side via the feedthrough connection. The connection is manufactured by inserting the covered lead into the hole and then the insulating part and inserted lead are placed in a vacuum, or a gas atmosphere with a pressure not exceeding 10 mbars, and then heated until the active solder has completely melted.

The electrically conductive feedthrough connection through a hole of a high-temperature-resistant and vacuum-proof insulating part, particularly of ceramic, glass, or a single crystal, is designed as a terminal lead covered with active solder and inserted into the hole, the terminal lead having a coefficient of thermal expansion less than that of the insulating part.

The feedthrough connection is used in a pressure sensor comprising a diaphragm and a substrate which have spaced-apart, flat inner surfaces which are provided with at least one conductive layer or resistive layer for forming at least one capacitor or strain gage, respectively, and are electrically connected to the respective rear side via the feed-through connection.

For the manufacture of a feed-through connection, the covered lead is inserted into the hole, and the thus equipped insulating part is placed in a vacuum and heated until the active solder has completely melted.

For the manufacture of a feed-through connection, the covered lead is inserted into the hole, and the thus equipped insulating part is heated in a gas atmosphere with a pressure not higher than 10 mbars ($=1$ kPa).

According to the journal "Solid State Technology", April 1985, pages 321 to 324, the commonly employed method of manufacturing such feed-through connections in alumina ceramic involves the use of an Mn—Mo paste which must be applied to the wall of the hole, sintered at a high temperature (approximately 1500° C.) in moist hydrogen, and subsequently electroplated with nickel. The nickel layer must be sintered as well. In the hole thus metallized, a terminal lead can then be soldered into place.

Because of the number of process steps to be performed, this manufacturing method is very complicated and costly. In addition, process control is highly critical, e.g., because of the danger of explosion resulting from the use of moist hydrogen, which requires expensive safety precautions or a special furnace. Furthermore, in the case of long, thin holes, the Mn—Mo paste can be applied only by hand, the applied layer having to be of uniform thickness. Moreover, Mn—Mo paste is not particularly suitable for very-high-purity alumina ceramics.

Accordingly, the object of the invention is to provide a feed-through connection which is generally suitable for high-temperature-resistant and vacuum-proof insulating parts, particularly of ceramic, glass, or a single crystal, and not only for alumina-ceramic parts, can be manufactured in a single high-temperature step and is inexpensive, mechanically heavily loadable, and high-vacuum-tight.

The active solder used in the invention consists of a soldering material, mostly a brazing solder such as Ag, Ag—Cu, or Ag—Cu13 In, alloyed with at least one reactive element, such as Ti, Zr, Be, Hf, or Ta, with Ti having proved to be the most effective alloying element. During the soldering process, the reactive element wets the surfaces of the parts to be soldered, so that no metallization, such as the above-mentioned Mn—Mo coating, is necessary.

In the case of oxide ceramic, the high affinity of the reactive element for oxygen causes a reaction with the ceramic, which leads to the formation of mixed oxides and free valency electrons. Active solder can also be used with nonoxide ceramic or glass without previous metallization.

Preferred active-solder alloys are ductile and contain 2 to 5% of Ti which is homogeneously embedded in a matrix of, e.g., Ag—Cu. They can be processed like normal brazing solders, so that the terminal leads, too, can readily be covered with them.

Typically commercially available active solders are the alloys Ag—Ti, Ag—Cu—Ti, and Ag—Cu—In—Ti, whose soldering temperatures range between 750° and 1000° C. Thus, step soldering (gradations in the melting points) is also possible with active solders. The strengths of active solders are identical with the strengths of comparable Ti-free brazing solders. The bond strength to ceramic, for example, is greater than, the strength of the ceramic itself; in a tensile test, the fracture will therefore lie in the ceramic, not in the ceramic-to-solder interface.

The active solder is preferably heated in a vacuum at at least $10^{-5}$ mbars ($=10^{-3}$ Pa), better in the $10^{-6}$ mbar ($=10^{-4}$-Pa) range. Very good vacuum is necessary in order to avoid reactions of the Ti with the residual gas and achieve good wetting of, e.g., ceramic.

To obtain specific soldering results, e.g., to reduce the evaporation of the solder or to reduce surface oxides, it may be advantageous to carry out the heating or soldering process in a defined gas atmosphere of inert gas and/or reactive gas. The partial pressures of these gases are preferably below 10 mbars ($=1$ kPa).

During active soldering, like during conventional soldering, the solder is completely melted. The soldering temperature of the active solder, however, should be 70° to 100° C. above the liquidus temperature to obtain an optimum reaction of the Ti with, e.g., ceramic. In this manner, high strength and vacuum tightness are achieved.

Pressure sensors with electrical feed-through connections in accordance with the invention are characterized by high mechanical strength, loadability, and resistance to temperature changes as well as by very good and very reliable vacuum tightness while being easy to manufacture. In addition, the quality of the feed-through connection can be examined quickly and simply by radiography with X-rays.

It is surprising that despite the very different temperature dependencies of the expansion coefficients of metal and, e.g., ceramic, an active solder can be used for soldering in feed-through connections, particularly of pressure sensors.

Further features and advantages of the invention will become apparent from the following description of an embodiment, which is illustrated in the accompanying drawings.

DETAILED DESCRIPTION OF THE DRAWINGS

Figure 1A:
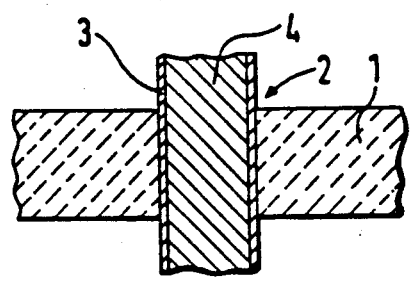
FIGS. 1a and 1b are schematic cross-sectional views of a feed-through connection.
Figure 1B:
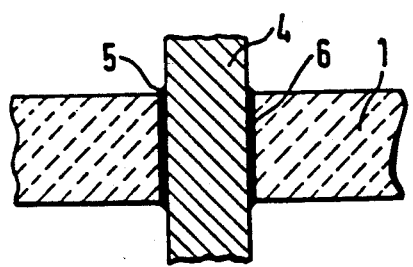

FIGS. 1a and 1b show a feed-through connection in schematic cross sections. FIG. 1a shows the condition before the heating of an insulating part 1, in which a terminal lead 4 covered with active solder 3 is inserted in a hole 2. FIG. 1b illustrates the cooled-down condition after the melting of the active solder; from the active-solder-covered terminal lead 4 of FIG. 1a, the feed-through connection 6, connecting this terminal lead with the insulating part 1 in a vacuum-tight manner by means of the solder layer 5, has formed.

Any detachment of the solder layer from the insulating part after cooling can be prevented by making the terminal lead 4 from a metal with a coefficient of thermal expansion less than that of the insulating part 1. During cooling, the insulating part and the terminal lead will then shrink to approximately the same extent, so that the active-solder layer will be virtually stress-free.

It is also possible, however, to make the coefficient of expansion of the terminal lead substantially less than that of the insulating part. In that case, the joint with the terminal lead and the insulating part are under pressure after the melting and cooling steps. This is especially important if the insulating part is made of brittle material, because the latter must not be subjected to any tensile stress.

The following numerical example illustrates this. The coefficient of expansion of alumina ceramic is about 7 ppm/K, and that of Ag—Cu active solder about 19 ppm/K. If use is made of an Mo terminal lead, whose coefficient of expansion is about 5 ppm/K, detachment of the solder layer from the ceramic is reliably avoided and vacuum tightness of the feed-through connection is assured even with larger to large hole diameters. This effect is particularly marked with the use of tungsten, whose coefficient of expansion at room temperature is 4.5 ppm/K. Tantalum (6.5 ppm/K), rhenium (5.9 ppm/K), molybdenum (5.0 ppm/K), and osmium (4.7 ppm/K) are also suitable.

If zirconium oxide (10.5 ppm/K) is used for the insulating material, other metals with a coefficient of expansion lower than 10.5 ppm/K are suitable as well.

Figure 2:
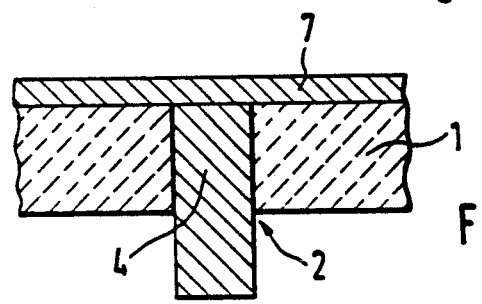
FIG. 2 is a schematic cross-sectional view of a development of the feed-through connection of FIG. 1.

FIG. 2 shows a development of the feed-through connection of FIG. 1 in a schematic cross section. As in FIG. 1a, a suitable length of a terminal lead 4 covered with active solder is inserted into the hole 2 so as to be flush with one end of the latter, and the active solder is melted on. After the solder has cooled down, the conductor path 7 is deposited by, e.g., sputtering. The conductor path 7 and the exposed surface of the terminal lead 4 form an electrically highly conductive and mechanical joint.

If the assemblies of FIGS. 1b and 2 form part of a pressure sensor, a conductive layer may be deposited on the respective underside by, e.g., sputtering, but this is not shown for the sake of clarity.

Figure 3:
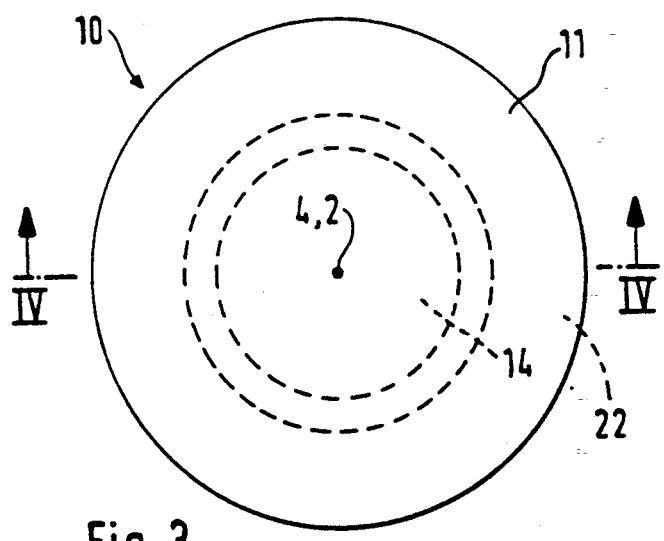
FIG. 3 is a plan view of a pressure sensor with feed-through connections.
Figure 4:
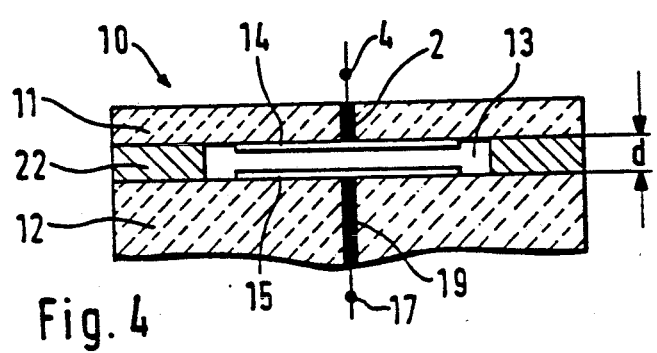
FIG. 4 is a section taken along line IV—IV of FIG. 3.

In a preferred application of the feed-through connection, the pressure sensor 10 of FIGS. 3 and 4 has a diaphragm 11 in the form of a circular disk with plane-parallel surfaces which is joined around its periphery to a circular substrate 12 sb as to be separated from the latter by a defined distance d, thus forming a chamber 13 between the flat surface of the substrate 12 and the opposite surface of the diaphragm 11. The diaphragm 11 and the substrate 12 are, for example, ceramic parts whose compositions may differ. The diaphragm 11 is elastic, so that it can deform when pressure is applied to it. The substrate 12 may be solid and rigid, but if desired, it may also be a flat elastic disk like the diaphragm 11. By means of the formed part 22, diaphragm 11 and substrate 12 are permanently joined together.

Within the chamber 13, those surfaces of the diaphragm 11 and the substrate 12 which face each other are provided with circular conductive metal layers 14 and 15, respectively. Connected to the conductive layer 14 is the terminal lead 4, which is sealed in the hole 2 and brought out through the diaphragm 11.

Similarly, the conductive layer 15 of the substrate 12 has a terminal lead 17 connected thereto which is sealed in a hole 19 and brought out through the substrate 12. The two conductive layers 14, 15 form the electrodes of a capacitor whose capacitance depends on the distance between the conductive layers. When the diaphragm 11 deforms under pressure, the distance between the two conductive layers 14, 15 changes, thereby changing the capacitance of the pressure sensor. This capacitance can be measured by means of an electronic circuit connected to the terminal leads 4, 17, and is, therefore, a measure of the pressure applied to the diaphragm 11. By dividing the conductive layers into an inner circular area and an outer circular area spaced from the latter, it is also possible to realize more than one capacitor.

The peculiarity of the pressure sensor illustrated in FIGS. 3 and 4 consists in the way the feed-through connections are designed. They may take the forms shown in FIGS. 1 and 2, which both use active solder. To make the connection between the parts 11, 12, a thermal process is used which allows a direct connection of the diaphragm 11 and the substrate 12 with the formed part 22, which is also made of active solder, without previous deposition of a metallized layer.

If, in the development explained with the aid of FIG. 2, a thin- or thick-film circuit is to be provided in the area of the conductor path 7, e.g., to realize the above-mentioned capacitance-measuring circuit, the substrate must be provided with an opening aligned with the terminal lead 4, so that it can be electrically connected to the latter by means of a conventional soft solder.

While the above-described use relates to a capacitive pressure sensor, the feed-through connections in accordance with the invention can also be successfully used in resistive pressure sensors.

We claim:

1. An electrically conductive feedthrough connection comprising:

an insulating member formed to include an aperture extending therethrough, the insulating member having a coefficient of thermal expansion; and a terminal lead covered with an active solder and soldered into the aperture, the terminal lead having a coefficient of thermal expansion less than the coefficient of thermal expansion of the insulating member, and the active solder having a coefficient of thermal expansion greater than the coefficient of thermal expansion of the insulating member.

2. The feedthrough connection of claim 1, further comprising a conductive layer formed on a surface of the insulating member, the conductive layer being electrically coupled to the terminal lead.

3. The feedthrough connection of claim 1, wherein the insulating member is a diaphragm of a pressure sensor and the terminal lead extends through the diaphragm, and further comprising a substrate coupled to the diaphragm, the substrate and diaphragm including spaced apart inner surfaces which each include at least one conductive layer configured to form at least one capacitor therebetween, the substrate being formed to include an aperture therethrough, and a second terminal lead covered with active solder and soldered into the aperture of the substrate.

4. The feedthrough connection of claim 1, wherein the insulating member is a diaphragm of a sensor and the terminal lead extends through the diaphragm, and further comprising a substrate coupled to the diaphragm, the substrate and diaphragm including spaced apart inner surfaces which each include at least one resistive layer configured to form at least one strain gauge, and a second terminal lead covered with active solder and soldered into the aperture of the substrate.

* * * * *